(12) United States Patent
Lee et al.

(10) Patent No.: US 8,518,282 B2
(45) Date of Patent: *Aug. 27, 2013

(54) METHOD OF CONTROLLING ETCH MICROLOADING FOR A TUNGSTEN-CONTAINING LAYER

(75) Inventors: Wonchul Lee, San Ramon, CA (US); Qian Fu, Pleasanton, CA (US); Shenjian Liu, San Ramon, CA (US); Bryan Pu, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 364 days.

This patent is subject to a terminal disclaimer.

(21) Appl. No.: 12/744,012

(22) PCT Filed: Nov. 13, 2008

(86) PCT No.: PCT/US2008/083412
§ 371 (c)(1),
(2), (4) Date: Feb. 9, 2011

(87) PCT Pub. No.: WO2009/067381
PCT Pub. Date: May 28, 2009

(65) Prior Publication Data
US 2011/0151670 A1    Jun. 23, 2011

Related U.S. Application Data

(60) Provisional application No. 60/989,597, filed on Nov. 21, 2007.

(51) Int. Cl.
*B44C 1/22* (2006.01)
*H01L 21/3065* (2006.01)

(52) U.S. Cl.
USPC ............ 216/37; 216/58; 216/67; 216/74; 216/75; 438/685; 438/695; 438/706

(58) Field of Classification Search
USPC ............ 216/37, 58, 67, 74, 75; 438/695, 438/706, 685
See application file for complete search history.

(56) References Cited

U.S. PATENT DOCUMENTS

| | | | |
|---|---|---|---|
| 4,778,563 A | 10/1988 | Stone | |
| 4,985,114 A | 1/1991 | Okudaira et al. | |
| 5,338,398 A | 8/1994 | Swejkowski et al. | |
| 5,705,433 A | 1/1998 | Olson et al. | |
| 7,235,492 B2 | 6/2007 | Samoilov | |
| 7,413,992 B2 | 8/2008 | Tan et al. | |
| 7,629,255 B2 * | 12/2009 | Fu et al. | 438/672 |
| 2003/0092280 A1 * | 5/2003 | Lee et al. | 438/720 |
| 2003/0173333 A1 * | 9/2003 | Wang et al. | 216/67 |
| 2003/0235995 A1 * | 12/2003 | Oluseyi et al. | 438/710 |
| 2005/0026440 A1 * | 2/2005 | Langley | 438/691 |
| 2006/0169669 A1 | 8/2006 | Zojaji et al. | |
| 2007/0199657 A1 | 8/2007 | Kofuji et al. | |

FOREIGN PATENT DOCUMENTS

| | | |
|---|---|---|
| JP | 05-283378 A | 10/1993 |
| JP | 2001-053145 A | 2/2001 |

* cited by examiner

*Primary Examiner* — Shamim Ahmed
(74) *Attorney, Agent, or Firm* — Beyer Law Group LLP

(57) ABSTRACT

A method for etching features of different aspect ratios in a tungsten containing layer is provided. An etch gas is provided containing a tungsten etch component and a deposition component. A plasma is formed from the provided etch gas. A tungsten containing layer patterned with wide and narrow features is etched with the provided plasma.

20 Claims, 4 Drawing Sheets

METHOD OF CONTROLLING ETCH MICROLOADING FOR A TUNGSTEN-CONTAINING LAYER

BACKGROUND OF THE INVENTION

The present invention relates to etching a conductive layer having features of different aspect ratios. More specifically, the present invention relates to reducing microloading during the etching of a conductive layer having both open and dense features.

During semiconductor wafer processing, sometimes a semiconductor device may have both open and dense features. The open features have wider widths, while the dense features have narrower widths. As a result, the semiconductor device may have features of different aspect ratios. The aspect ratio of a feature is the ratio between the height and the width of the feature. Thus, if the heights of all the features of a semiconductor device are approximately the same, then the open features have relatively low aspect ratios, while the dense features have relatively high aspect ratios.

During the etching of such semiconductor devices having features of different aspect ratios, and especially when the aspect ratios of the features are high, microloading is becoming a common problem. As a result, the open features etch faster than the dense features. Often, when the etching of the open features is completed, the etching of the dense features may only have been completed partially. This is known as "aspect ratio dependent etching." Continuing the etch process in order to complete the etching of the dense features may cause the open features to be etched into the layer(s) beneath the layer being etched, such as the substrate, and damage the semiconductor devices.

SUMMARY OF THE INVENTION

To achieve the foregoing and in accordance with the purpose of the present invention, in one embodiment, a method for controlling etch rate microloading for a tungsten-containing layer masked by both narrow and wide features is provided. An etch gas with a tungsten etch component and a deposition component which produces non conformal deposition is provided. A plasma is formed from the provided etch gas. A tungsten containing layer is etched with the plasma formed from the provided etch gas.

In another embodiment, a method for etching a tungsten containing layer through a mask with wide and narrow features is provided. An etch gas with a tungsten etch component and a deposition component which produces non conformal deposition is provided, wherein the deposition component comprises a silicon containing component and an oxygen containing component. A plasma is formed from the provided etch gas. A tungsten containing layer is etched with the plasma formed from the provided etch gas.

An apparatus is provided for etching a tungsten containing layer through a mask with wide and narrow features comprising a plasma reactor and computer readable code for providing a tungsten etch gas and a deposition gas, transforming the gas mixture into a plasma, and for stopping the etch gas mixture gas flow.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

During the etching of semiconductor devices having features of different widths or different aspect ratios, and especially when the aspect ratios of the features are high, etch rate microloading is becoming a common problem. Due to diffusion limitations, the etching chemicals are able to go into the wider open features faster than into the narrower dense features. Similarly, the byproducts of the etch process go out of the wider open features faster than the out of narrower dense features. As a result, open features, i.e., features with wider widths, etch faster than dense features, i.e., features with narrow widths.

Figure 1:
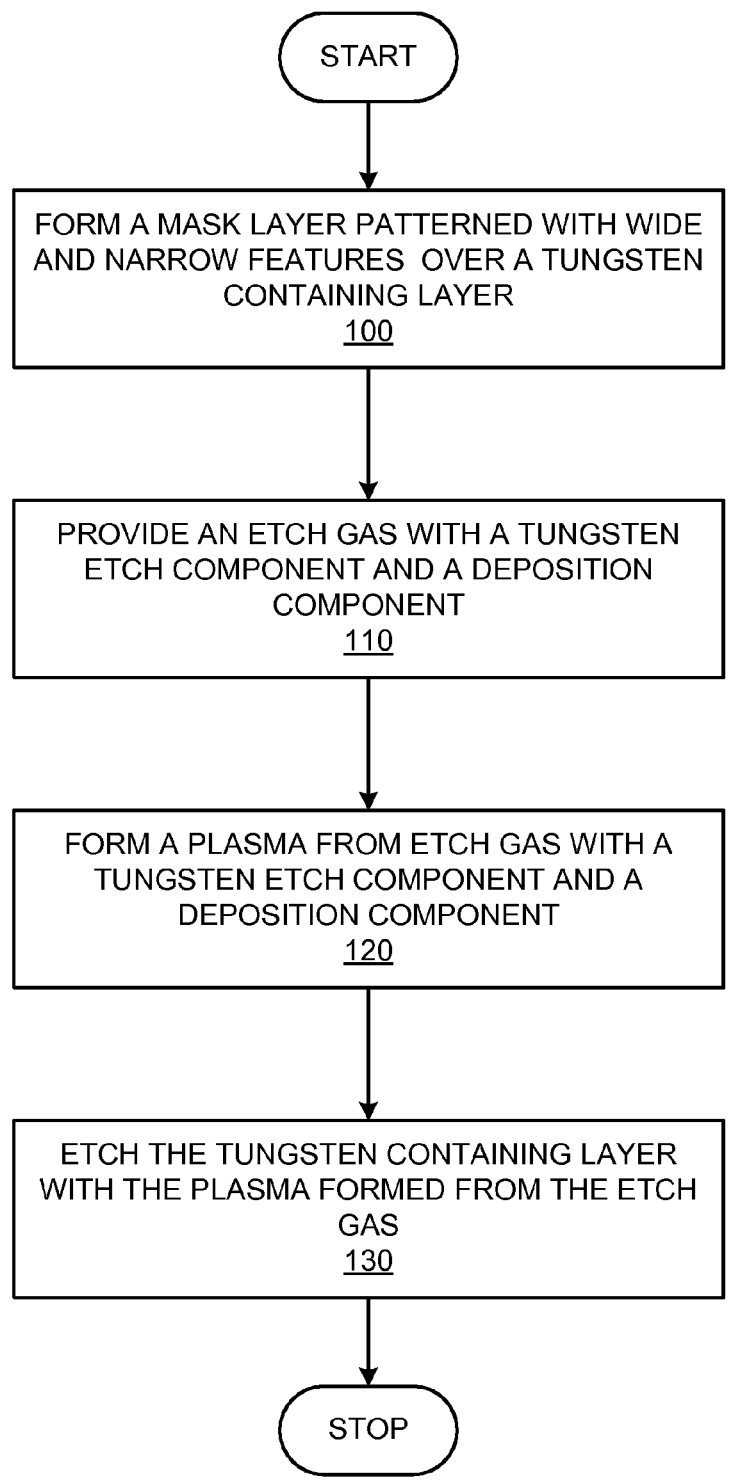
FIG. 1 is a high level flow chart of an embodiment of the invention.

To facilitate understanding, FIG. 1 is a high level flow chart of a process used in an embodiment of the invention. A mask layer patterned with features of different aspect ratios (i.e., open and dense features) is formed over a tungsten containing layer (step 100). The open and dense features will eventually be etched into the tungsten containing layer. In this embodiment, the open (wider) and dense (narrower) features are patterned using a mask over a tungsten layer.

An etch gas is provided (step 110) which contains a tungsten etch component and a deposition component. A plasma is formed from this etch gas (step 120), and is used to etch the wider and narrower features into the tungsten-containing layer (step 130). The etching of the tungsten containing layer is aspect ratio dependent because the open (wider) features are etched into the tungsten containing layer faster than the dense (narrower) features due, in part, to etch component diffusion limitations. However, the deposition of the depositing component is also aspect ratio dependent, so the deposition component deposits more thickly on the bottom surfaces of wide features than the bottom of narrow features due, in part, to depositing component diffusion limitations. This selective deposition in the wide features inhibits etching of the tungsten containing layer in the wide features relative to the narrow features. The etch rate between the wide and narrow features may thus be balanced and etch rate microloading may be eliminated or even reversed.

Figure 2:
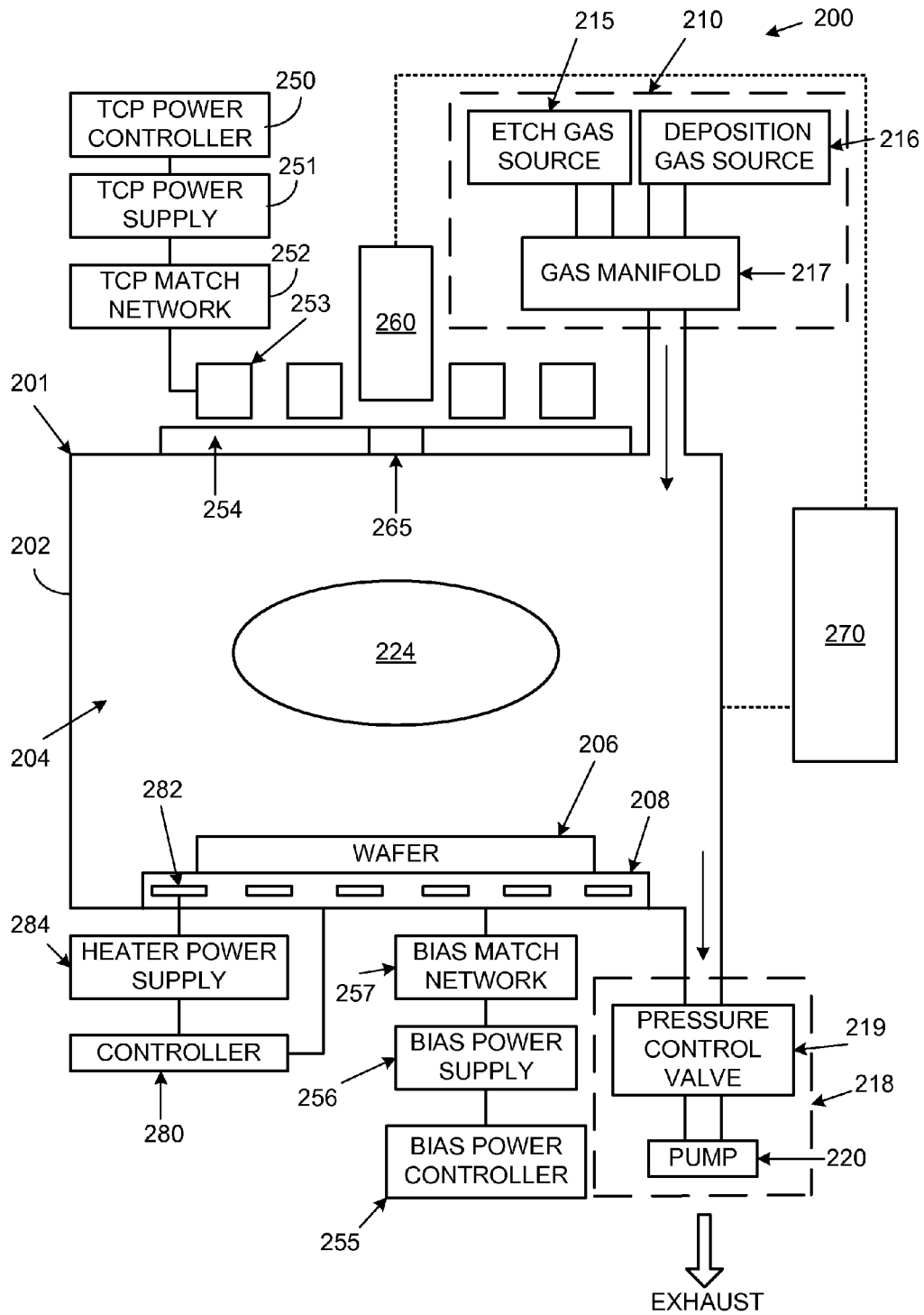
FIG. 2 is a schematic view of a plasma processing chamber that may be used for etching.

To etch the tungsten containing layer, the tungsten containing layer and the related stack may be placed in a plasma processing chamber. FIG. 2 is a schematic view of a plasma processing system 200, including a plasma processing tool 201. The plasma processing tool 201 is an inductively coupled plasma etching tool and includes a plasma reactor 202 having a plasma processing chamber 204 therein. A transformer coupled power (TCP) controller 250 and a bias power controller 255, respectively, control a TCP power supply 251 and a bias power supply 256 influencing the plasma 224 created within plasma chamber 204.

The TCP power controller 250 sets a set point for TCP power supply 251 configured to supply a radio frequency signal at 13.56 MHz, tuned by a TCP match network 252, to a TCP coil 253 located near the plasma chamber 204. An RF transparent window 254 is provided to separate TCP coil 253 from plasma chamber 204 while allowing energy to pass from TCP coil 253 to plasma chamber 204. An optically transparent window 265 is provided by a circular piece of sapphire having a diameter of approximately 2.5 cm (1 inch) located in an aperture in the RF transparent window 254.

The bias power controller 255 sets a set point for bias power supply 256 configured to supply an RF signal, tuned by bias match network 257, to a chuck electrode 208 located within the plasma chamber 204 creating a direct current (DC) bias above electrode 208 which is adapted to receive a substrate 206, such as a semi-conductor wafer work piece, being processed.

A gas supply mechanism or gas source 210 includes sources of gases attached via a gas manifold 217 to supply the proper chemistry required for the processes to the interior of the plasma chamber 204. One source of gas may be the etch gas source 215 that supplies the proper chemistry for etching the tungsten containing layer. Another source of gas may be the deposition gas source 216 that supplies the proper chemistry for depositing onto the tungsten containing layer. A gas exhaust mechanism 218 includes a pressure control valve 219 and exhaust pump 220 and removes particles from within the plasma chamber 204 and maintains a particular pressure within plasma chamber 204.

A temperature controller 280 controls the temperature of heaters 282 provided within the chuck electrode 208 by controlling a heater power supply 284. The plasma processing system 200 also includes electronic control circuitry 270. The plasma processing system 200 may also have an end point detector 260.

Figure 3A:
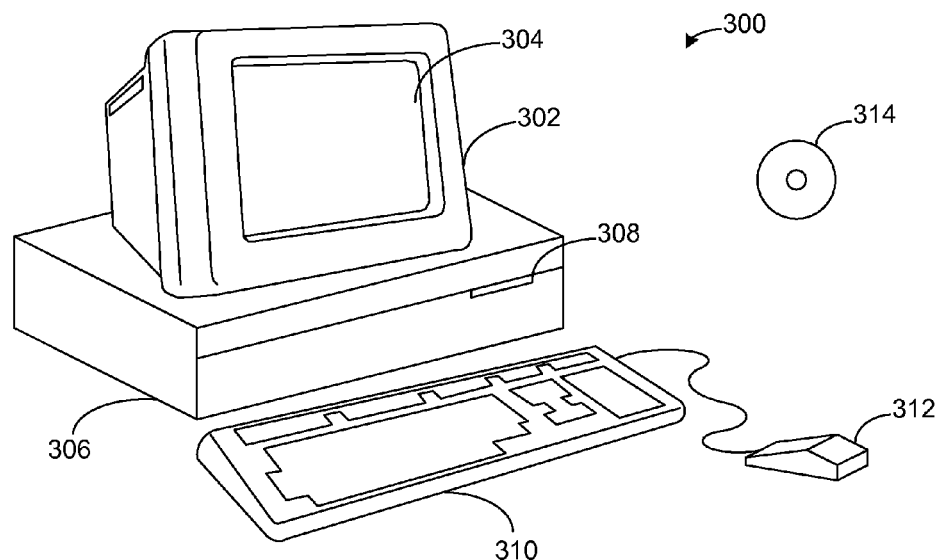
FIGS. 3A-B illustrate a computer system, which is suitable for implementing a controller used in embodiments of the present invention.
Figure 3B:
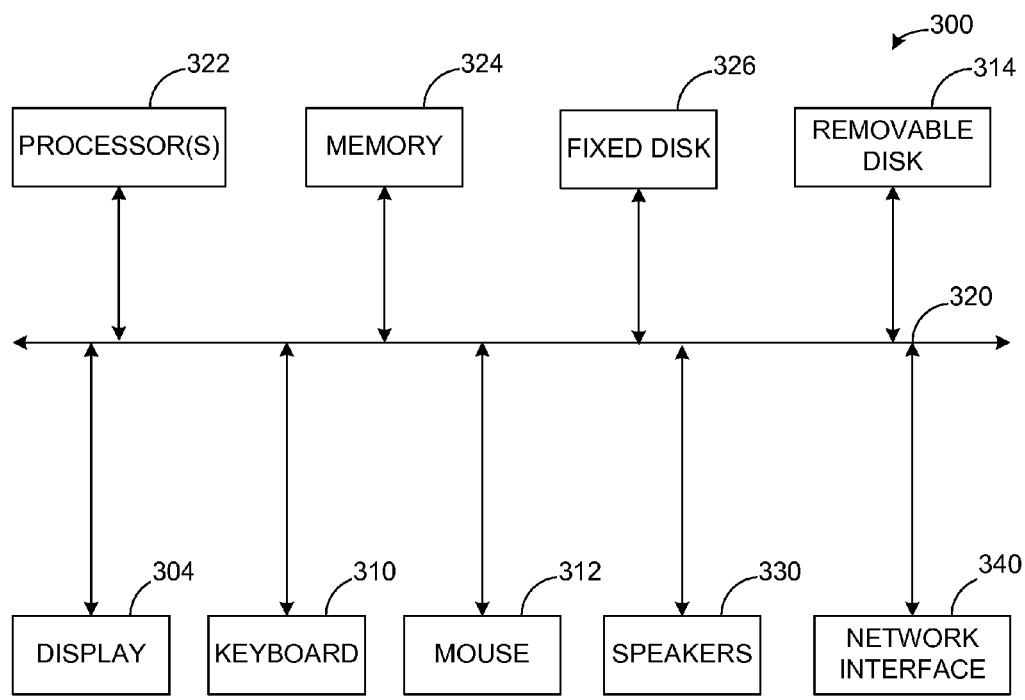

FIGS. 3A and 3B illustrate a computer system, which is suitable for implementing the control circuitry 270 used in one or more embodiments of the present invention. FIG. 3A shows one possible physical form of the computer system 300. Of course, the computer system may have many physical forms ranging from an integrated circuit, a printed circuit board, and a small handheld device up to a huge super computer. Computer system 300 includes a monitor 302, a display 304, a housing 306, a disk drive 308, a keyboard 310, and a mouse 312. Disk 314 is a computer-readable medium used to transfer data to and from computer system 300.

FIG. 3B is an example of a block diagram for computer system 300. Attached to system bus 320 is a wide variety of subsystems. Processor(s) 322 (also referred to as central processing units, or CPUs) are coupled to storage devices, including memory 324. Memory 324 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 326 is also coupled bi-directionally to CPU 322; it provides additional data storage capacity and may also include any of the computer-readable media described below. Fixed disk 326 may be used to store programs, data, and the like and is typically a secondary storage medium (such as a hard disk) that is slower than primary storage. It will be appreciated that the information retained within fixed disk 326 may, in appropriate cases, be incorporated in standard fashion as virtual memory in memory 324. Removable disk 314 may take the form of any of the computer-readable media described below.

CPU 322 is also coupled to a variety of input/output devices, such as display 304, keyboard 310, mouse 312, and speakers 330. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 322 optionally may be coupled to another computer or telecommunications network using network interface 340. With such a network interface, it is contemplated that the CPU might receive information from the network, or might output information to the network in the course of performing the above-described method steps. Furthermore, method embodiments of the present invention may execute solely upon CPU 322 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level of code that are executed by a computer using an interpreter. Computer readable media may also be computer code transmitted by a computer data signal embodied in a carrier wave and representing a sequence of instructions that are executable by a processor.

Figure 4A:
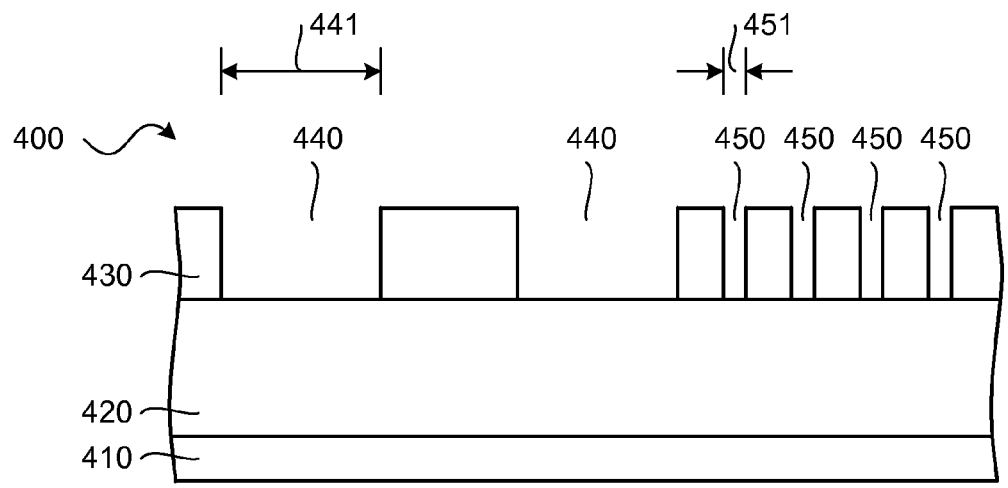
FIGS. 4A-C are schematic views of a stack processed according to an embodiment of the invention.
Figure 4B:
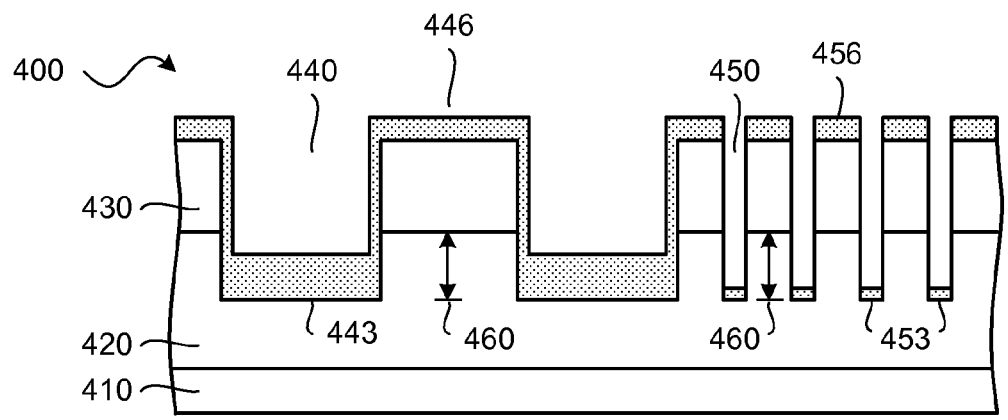
Figure 4C:
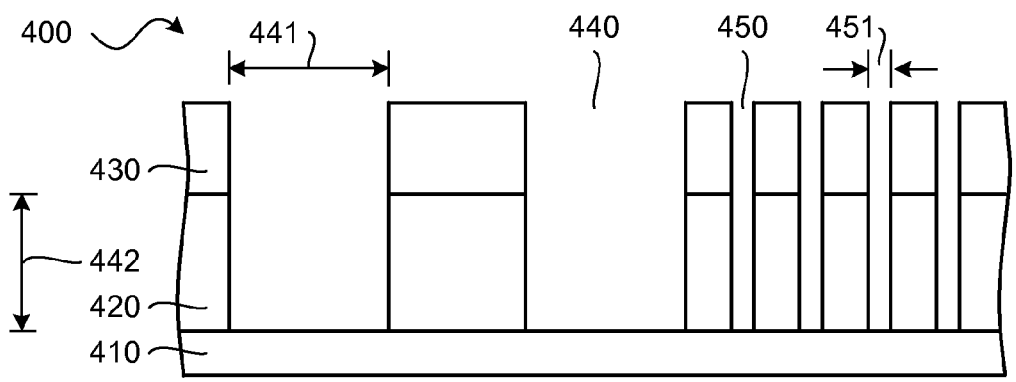

To facilitate understanding of the invention, FIGS. 4A-C are schematic views of a stack processed according to an embodiment of the invention.

A mask layer patterned with features of different aspect ratios (i.e., open and dense features) is formed over a tungsten containing layer (step 100). FIG. 4A is a schematic cross-sectional illustration of a stack 400 with a substrate 410, over which an etch layer 420 is provided. The etch layer 420 is a tungsten-containing layer, preferably tungsten (W). A mask layer 430 is present over the tungsten-containing layer 420. The mask layer 430 may be a carbon-based mask, such as a mask containing CH, CF, amorphous carbon, or the like. Alternatively, the mask layer 430 may be an inorganic hard mask, such as silicon dioxide, silicon nitride, or the like. Preferably, the mask layer is SiO-based, such as thermal oxide or TEOS. The mask layer 430 is patterned with both open features 440 and dense features 450.

The widths 441 of the open features 440 are relatively greater than the widths 451 of the dense features 450. In other words, the open features 440 have wider openings than the dense features 450. Thus, the open features 440 may also be referred to as the "wider" or "wide" features, and the dense features 450 may also be referred to as the "narrower" or "narrow" features. Preferably, the open or wider features 440 are at least 2 times wider than the dense or narrower features 450. More preferably, the open or wider features 440 are at least 5 times wider than the dense or narrower features 450. Most preferably, the open or wider features 440 are at least 10 times wider than the dense or narrower features 450.

An etch gas is provided comprising a mixture of a tungsten etch component and a deposition component (step 110). The deposition component comprises a silicon-containing component and an oxygen containing component. The silicon-containing component of the etch gas may be any gaseous chemical containing silicon. For example, the silicon-containing component may be an organic siloxane; that is, a chemical compound of silicon, oxygen, and carbon based on the structural unit $R_2SiO$ where R is an alkyl group such as methyl, ethyl, propyl, or the like, and which has a boiling point at or below 150 degrees Celsius. Examples of suitable siloxane compounds include but are not limited to tetramethyldisiloxane $[((CH_3)_2SiH)_2O]$, pentamethyldisiloxane, and hexamethyldisiloxane. The silicon-containing compound may also be a chemical compound similar to siloxane but where the bridging oxygen is replaced with a nitrogen (as in the examples of tetramethyldisilazane, hexamethyldisilazane, or N-methyl-N-silyl-Silanamine), or compounds of silicon, carbon, and hydrogen such as disilylacetylene $[C_2H_6Si_2]$.

Alternatively, the silicon-containing component may be an organosilicon compound based on the structural unit $SiA_xZ_{(4-x)}$ where A is selected from the group H, F, Cl, Br, or I, where Z is an alkyl group such as methyl, ethyl, propyl, or the like, where x may vary from zero to four, and which has a boiling point at or below 150 degrees Celsius. For example, the silicon-containing component may be dimethylsilane $[(CH_3)_2SiH_2]$ where x equals two, A is hydrogen, and Z is a methyl group. In another example, the silicon-containing component may be dichlorodimethylsilane $[(CH_3)_2SiCl_2]$ where x equals two, A is chlorine, and Z is a methyl group. In yet another example, the silicon-containing component may be tetramethylsilane $[(CH_3)_4Si]$ where x equals zero and Z is an methyl group.

Preferably, the silicon containing component is silane-based; that is, a silane, or a halogenated silane. A silane is comprised of $SiH_4$ or higher silanes with the empirical formula $Si_xH_{(2x+2)}$ where x has a minimum value of one. A halogenated silane is comprised of a compound with the empirical formula $Si_xA_yH_{(2x+2-y)}$, where A is selected from the group F, Cl, Br, or I, and x and y may each have a minimum value of one. More preferably, the silane-based silicon containing component is a halogenated silane. Most preferably, the silane-based silicon containing component is silicon tetrachloride ($SiCl_4$).

The oxygen containing component of the deposition component, in some cases, may be provided via the silicon containing component process gas. For example, if the silicon containing component comprises a siloxane, the oxygen containing component of the deposition component may be the oxygen from the siloxane. In other cases, the oxygen containing component of the deposition component may be supplied separately from the silicon containing component. That is, the oxygen containing component may contain elemental oxygen but not silicon. For example, the oxygen containing component may be $CO$, $CO_2$, $O_3$, $H_2O$, or $O_2$. Alternatively, the oxygen for the oxygen containing component of the deposition component may be from both silicon containing process gas, such as a siloxane, and a separate oxygen containing component, which does not contain silicon. Preferably, the oxygen containing component of the deposition component is from a separate oxygen containing component, which contains elemental oxygen but not silicon. Most preferably, the oxygen containing component is $O_2$.

A plasma is formed from the provided etch gas mixture (step 120) and a tungsten containing layer is etched (step 130). FIG. 4B shows a schematic cross-sectional illustration of the stack 400 during the etch process (step 130). The etching of the tungsten containing layer 420 is aspect ratio dependent due, in part, to the etch components being diffusion limited. The open (wider, low aspect ratio) features 440 are etched faster than the dense (narrower, high aspect ratio) features 450. However, deposition on the tungsten containing layer from the deposition component is selective to the open features due, in part, to the deposition component being diffusion limited. Deposition 443 inside, and especially on the bottom of the open (wider, low aspect ratio) features 440 is more than deposition 453 inside the dense (narrower, high aspect ratio) features 450 because deposition chemicals go inside the open features 440 more readily than the dense features 450. Thus, the deposition is also aspect ratio dependent.

The etch and deposition processes occur at the same time in both the open 440 and the dense 450 features. The greater deposition on the bottom of the open features 440 compensates for the faster etching of the open features 440, resulting in substantially the same depth 460 of conductive layer 420 etched away for both open 440 and narrow 450 features during the etch step. That is, the lower etch rate in the open features 440 resulting from the selective deposition in those features 443 results in zero microloading. Reverse or positive microloading can also be achieved by modifying the deposition component in the etch step 130 to produce even more deposition in the open features 440 relative to the narrow features 450.

Furthermore, the deposition is non-conformal, such that there is little deposition on the sidewalls of the features in comparison to the deposition on the bottom of the features. Having little or no deposition over the sidewalls of the features may prevent narrowing the opening of the features.

There may also be some amount of deposition 446, 456 on top of the mask layer 430. Etching of the mask layer 430 also occurs in the etch step 130. Deposition 446 and 456 on top of the mask layer 430 reduces the etch rate (i.e. erosion and/or corrosion) of the mask layer 430.

When the etch component and the deposition component are reasonably balanced, i.e. when the etch rate of layer 420 is substantially the same in both the open 440 and dense 450 features, the thickness of deposition layer 443 in the open features 440 and deposition layers 446 and 456 on mask layer 430 may be very small, e.g. monolayer or sub-monolayer. The relative thicknesses of the deposition layers in FIG. 4B are therefore exaggerated so as to illustrate the selective deposition process.

The etch component and the deposition component are provided in a single step (step 130) as the tungsten containing layer is etched, until the tungsten containing layer is completely etched (i.e. endpoint is achieved for the etch step). An example of an etch recipe in which the deposition component and etch components are reasonably balanced so as to eliminate etch rate microloading is as follows: a process pressure of 4 milliTorr, plasma power of 900 watts, wafer bias power of 90 watts, $Cl_2$ gas flow of 30 standard cubic centimeters per minute ("sccm"), $NF_3$ gas flow of 25 sccm, $O_2$ gas flow of 30 sccm, $N_2$ gas flow of 70 sccm, $SiCl_4$ gas flow of 13 sccm, wafer substrate temperature setpoint of 60 degrees Celsius.

FIG. 4C shows a schematic cross-sectional illustration of the stack 400 after the tungsten containing layer 420 has been completely etched. The features 440 and 450 have reached the bottom of the tungsten containing layer 420 in both the wide features 441 and the narrow features 451. That is, there is no tungsten containing layer remaining in the narrow features 450 when the tungsten containing layer has been completely removed from the bottom of the wide features 440. The nonconformal deposition has prevented narrowing of the openings in the wide features 441 and the narrow features 451, and deposition deposited on top of the features during the etch has reduced the erosion of the mask 430.

After etching is complete, the widths 441 of the open (wider) features 440 are relatively greater than the widths 451 of the dense (narrower) features 450. The heights 442 of both the open (wider) features 440 and the dense (narrower) features 450 are approximately the same. Thus, the aspect ratios of the open (wider) features 440 are relatively lower or smaller than the aspect ratios of the dense (narrower) features 450. In one example, the aspect ratios of the narrow features in the tungsten containing layer 420 may be greater than 1:1, such as when the widths of the dense (narrower) features are approximately 80 nanometers (nm) and the heights of the features are 110 nm. In another example, the aspect ratios of the narrow features in the tungsten containing layer 420 may be greater than 7:1. In a third example, the aspect ratios of the narrow features in the tungsten containing layer 420 may be greater than 15:1.

While this invention has been described in terms of several preferred embodiments, there are alterations, permutations, modifications, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method of etching a tungsten containing layer through a mask with wide and narrow features, comprising
   (a) providing an etch gas mixture comprising a tungsten etch component and a deposition component which produces non conformal deposition;
   (b) forming a plasma from the etch gas mixture; and
   (c) etching the tungsten containing layer using the plasma formed from the etch gas mixture.

2. The method, as recited in claim 1, wherein the deposition component selectively deposits more on bottoms of wide features than bottoms of narrow features, which reduces microloading.

3. The method, as recited in claim 2, wherein the deposition component selectively deposits less on sidewalls of the features than in the bottom of features.

4. The method, as recited in claim 3, wherein the deposition component comprises a silicon-containing component and an oxygen containing component.

5. The method, as recited in claim 4, wherein the silicon-containing component is an organic siloxane.

6. The method, as recited in claim 4, wherein the silicon-containing component is an organosilicon.

7. The method, as recited in claim 4, wherein the silicon containing component is silane-based.

8. The method, as recited in 7, wherein the silicon-containing component is a halogenated silane.

9. The method, as recited in claim 8, wherein the halogenated silane is $SiCl_4$.

10. The method, as recited in claim 4, wherein the oxygen-containing component is oxygen ($O_2$).

11. The method, as recited in claim 1, wherein the deposition component deposits on the top of the mask to reduce the mask etch rate during the tungsten etch step.

12. The method, as recited in claim 11, wherein the mask is a hardmask.

13. The method, as recited in claim 12, wherein the mask is $SiO_2$, $Si_3N_4$ or SiON.

14. The method, as recited in claim 4, wherein the etch component and the deposition component are provided in a single step as the tungsten containing layer is etched.

15. The method, as recited in claim 14, wherein the etch component and the deposition component are provided in a single step as the tungsten containing layer is etched until the tungsten containing layer is completely etched.

16. The method, as recited in claim 15, wherein the etch component is diffusion limited into narrow features.

17. The method, as recited in claim 4, wherein the deposition component is diffusion-limited into narrow features.

18. A method of etching a tungsten containing layer through a mask with wide and narrow features, comprising:
   (a) providing an etch gas mixture comprising a tungsten etch component and a deposition component, wherein the deposition component comprises a silicon containing component and an oxygen containing component,
   (b) forming a plasma from the etch gas mixture; and
   (c) etching the tungsten containing layer using the plasma formed from the etch gas mixture, wherein
      the deposition component deposits more on bottoms of wide features than bottoms of narrow features, and
      the deposition component selectively deposits less on sidewalls of the features than in the bottom of features.

19. The method, as recited in claim 18 wherein the silicon containing component of the deposition component is $SiCl_4$ and the oxygen containing component of the deposition component is $O_2$.

20. The method, as recited in claim 1, wherein the deposition component selectively deposits less on sidewalls of the features than in the bottom of features.

* * * * *